United States Patent
Jacobs, II et al.

(10) Patent No.: US 11,810,161 B2
(45) Date of Patent: *Nov. 7, 2023

(54) BUSINESS VARIABLE OPTIMIZATION FOR MANUFACTURE OR SUPPLY OF DESIGNED PRODUCTS

(71) Applicant: Desprez, LLC, New London, NH (US)

(72) Inventors: James L. Jacobs, II, Rye Beach, NH (US); John E. Cronin, Bonita Springs, FL (US); Kyle W. Kulp, Burlington, VT (US); Steven M. Lynch, Hudson, NH (US)

(73) Assignee: Desprez, LLC, New London, NH (US)

( * ) Notice: Subject to any disclaimer, the term of this patent is extended or adjusted under 35 U.S.C. 154(b) by 238 days.

This patent is subject to a terminal disclaimer.

(21) Appl. No.: 17/331,033

(22) Filed: May 26, 2021

(65) Prior Publication Data
US 2021/0279779 A1    Sep. 9, 2021

Related U.S. Application Data

(63) Continuation of application No. 14/928,728, filed on Oct. 30, 2015, now Pat. No. 11,023,934.
(Continued)

(51) Int. Cl.
*G06Q 30/02*      (2023.01)
*G06Q 30/0283*    (2023.01)
(Continued)

(52) U.S. Cl.
CPC ......... *G06Q 30/0283* (2013.01); *G06F 30/00* (2020.01); *G06Q 30/0621* (2013.01); *G06Q 30/0643* (2013.01); *G06Q 50/04* (2013.01)

(58) Field of Classification Search
CPC ........... G06Q 30/0283; G06Q 30/0621; G06Q 30/0643; G06Q 50/04; G06F 30/00
(Continued)

(56) References Cited

U.S. PATENT DOCUMENTS

2006/0041502 A1* 2/2006 Blair ...................... H04L 69/08
                                                                  705/37
2006/0129462 A1* 6/2006 Pankl ................. G06Q 30/0613
                                                                 705/26.81
(Continued)

FOREIGN PATENT DOCUMENTS

JP         2007034599 A   *  2/2007

OTHER PUBLICATIONS

Davis, Gerald; "3-D CAD: Modeling With Product Variation as the Design Intent", Jul. 2012; The Fabricator, 3 pages (Year: 2012).*
(Continued)

*Primary Examiner* — Shannon S Campbell
*Assistant Examiner* — Freda A Nelson
(74) *Attorney, Agent, or Firm* — CALDWELL INTELLECTUAL PROPERTY LAW

(57) ABSTRACT

A system comprising an electronic pricing system configured to receive information corresponding to a designed product and determine an initial price(s) as well as initial values of other business variables associated with the price. The system allows a user to enter a change to a price or the other business variable to instantly discover how the change affects other variables and optionally how the change affects one or more allowable ranges of acceptable values of other variables. The user can then lock the value of one or more of the variables and prices and change others to instantly (Continued)

discover how a change to one affects the others. The user can then order manufacture of the designed product as a function of values of price and other business variables.

18 Claims, 8 Drawing Sheets

Related U.S. Application Data

(60) Provisional application No. 62/072,694, filed on Oct. 30, 2014.

(51) Int. Cl.
*G06Q 30/0601* (2023.01)
*G06Q 50/04* (2012.01)
*G06F 30/00* (2020.01)

(58) Field of Classification Search
USPC ............ 705/7.35, 26.4, 27.2, 29, 400, 26.1; 700/92, 182; 703/1
See application file for complete search history.

(56) References Cited

U.S. PATENT DOCUMENTS

| | | | | |
|---|---|---|---|---|
| 2006/0253214 A1* | 11/2006 | Gross | ...................... | G06F 30/00 705/26.1 |
| 2010/0241471 A1* | 9/2010 | Nylander | ............... | G06Q 50/08 700/107 |
| 2011/0106865 A1* | 5/2011 | Boss | ...................... | G06F 40/166 708/200 |
| 2013/0132273 A1* | 5/2013 | Stiege | ................ | G06Q 30/0283 705/41 |
| 2015/0254586 A1* | 9/2015 | Gorokhovsky | ...... | G06Q 10/063 705/7.23 |

OTHER PUBLICATIONS

Davis, Gerald; "3-D CAD: Modeling With Product Variation as the Design Intent", Jul. 2012; The Fabricator, 3 pages (Year: 2012) (Year: 2012).*

* cited by examiner

228A

| Log | | Quantity (units) | Lead Time (weeks) | Total Price ($) | Price/unit ($) |
|---|---|---|---|---|---|
| Minimums and Maximums | | 10 – 1,000 | 1 – 12 | 200 – 10,000 | $5 - $20 |
| State 1 | Value | 100 | 6 | 1,500 | $15 |
| | Lock Status | Unlocked | Unlocked | Unlocked | Unlocked |
| State 2 | Value | 500 | 9 | 5,000 | $10 |
| | Lock Status | Unlocked | Unlocked | Unlocked | Unlocked |
| State 3 | Value | 500 | 8 | 5,500 | $11 |
| | Lock Status | Locked at 500 | Unlocked | Unlocked | Unlocked |

| Legend: | Current Change |
|---|---|
| | Resulting Adjustment |

FIG. 5

BUSINESS VARIABLE OPTIMIZATION FOR MANUFACTURE OR SUPPLY OF DESIGNED PRODUCTS

CROSS-REFERENCE TO RELATED APPLICATIONS

This application is a continuation of Non-provisional application Ser. No. 14/928,728 filed on Oct. 30, 2015 and entitled "BUSINESS VARIABLE OPTIMIZATION FOR MANUFACTURE OR SUPPLY OF DESIGNED PRODUCTS," the entirety of which is incorporated herein by reference. This application claims the benefit of priority of U.S. Provisional Patent Application Ser. No. 62/072,694, filed on Oct. 30, 2014, and titled "BUSINESS VARIABLE OPTIMIZATION FOR MANUFACTURE OR SUPPLY OF DESIGNED PRODUCTS," which is incorporated by reference herein in its entirety.

FIELD OF THE INVENTION

The present invention generally relates to the field of manufacture of machine-designed products, and in particular to the optimization of business variables related to manufacture or sale of such products.

BACKGROUND

Computer-aided design (CAD) programs are typically utilized to create, model, and optimize the design of a product or article for subsequent manufacture, often by modeling a three-dimensional (3D) representation of the designed product. CAD programs typically include a user interface for enabling a user to input design requirements, constraints, required performance criteria, testing criteria, and required elements or materials. Once a product is designed, designers and engineers then need to consider how it will be manufactured. If the design was made specifically for a particular manufacturer, in the case such as an in-house manufacturer, then amongst the constraints imposed on the product design are those that arise from the available capacity and other attributes of the specific manufacturer in question.

In making such decisions, users grapple with optimizing the values of related business variables. If a certain quantity of product is desired, the purchaser needs to know when the product will be delivered, and at what price. If the purchaser is willing to pay a higher price, but needs a higher quantity, the purchaser needs to know how that will change delivery schedules. However, none of the prior art solutions enable a user to enter changes to multiple business variables to automatically display corresponding tradeoffs, in an environment of purchasing manufactured products.

SUMMARY OF THE DISCLOSURE

In an aspect a system of providing pricing for one or more instantiation of a structure defined in a three-dimensional (3D) computer model includes an electronic pricing system configured to automatedly determine and display a price for a product to be supplied and initial values for a plurality of business variables associated with the price as a function of the 3D computer model as a function of a computer assisted design (CAD) graphical user interface (GUI), wherein automatedly determining the price for a product to be supplied and initial values for the plurality for business variables comprises receiving, via the CAD GUI, an initiation for a price request, identifying, via an interrogator and in response to the received initiation for the price request, a discrete shape of a 3D computer model representing the product to be supplied as a function of a CAD system command, analyzing, via the interrogator, the identified discrete shape, wherein the analyzing comprises comparing the identified discrete shape to a manufacturing requirement, and determine the price for the product to be supplied and initial values for the plurality of business variables associated with the price as a function of the comparison of the identified discrete shape to the manufacturing requirement, receive a parameter interrelationship information, receive a request to lock a value of a first one of the price or one of the plurality of business variables from a user, lock the value of the first one of the price or one of the plurality of business variables, receive a value for a second one of the price or one of the plurality of business variables from a user, automatedly determine acceptable ranges for values of at least two of the plurality of business variables as a function of the parameter interrelationship information and automatedly indicating the acceptable ranges to a user, and automatedly determine and display updated values and an updated acceptable range for one or more of the price and the plurality of business variables.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 5 is a table showing exemplary data that may result from executing the method set forth in FIGS. 3 and 4;

DETAILED DESCRIPTION

Aspects of the present disclosure include methods, systems, and software for optimizing business variables related to manufacture or sale of such products, which may be embodied in any of several ways. In some embodiments, various aspects of the methods, systems, and software disclosed herein may be included, for example, in a 3D CAD program. Additionally or alternatively, one or more of the methods, systems, and software disclosed herein may interact with a CAD or other suitable software product through an appropriate interface, such as an application program interface (API). Any code modules of the present disclosure that are integrated into an existing CAD or other suitable software product may be written in an applicable programming language for such products. A person of ordinary skill in the art will readily recognize that code sequences that work with software products through their APis can be embodied in any suitable computer programming language.

Herein, a "structure" (or the "product" that is designed) may be any object or part having a particular geometry. A 3D computer "model" may be a virtual representation of a structure and may be created using an appropriate CAD program and/or from image and video data. A "designer" or "user" may be the designer of a 3D computer model, a purchaser, an agent of the purchaser, a consumer, a home user, or a customer, among others. A structure may be a discrete part or an assembly of parts. Some examples of a structure include a piece of sheet metal, a solid cube, a cylindrical pipe, an injection molded plastic toy, a machined part, an article of clothing such as a shirt made of cotton, and an assembly of various parts such as a motor vehicle, among others. A design may refer to a 3D computer model of a part or an assembly of 3D computer models of parts that may be a virtual representation of a particular structure and may be created using one or more appropriate CAD programs. Notably, while the present disclosure makes reference to 3D computer models for sheet metal products, aspects of the present disclosure can be applied to other types of products such as machined parts, 3D printed parts, discrete parts, and assemblies of parts, among others, as will be apparent to those of ordinary skill in the art after reading this disclosure in its entirety.

Figure 1:
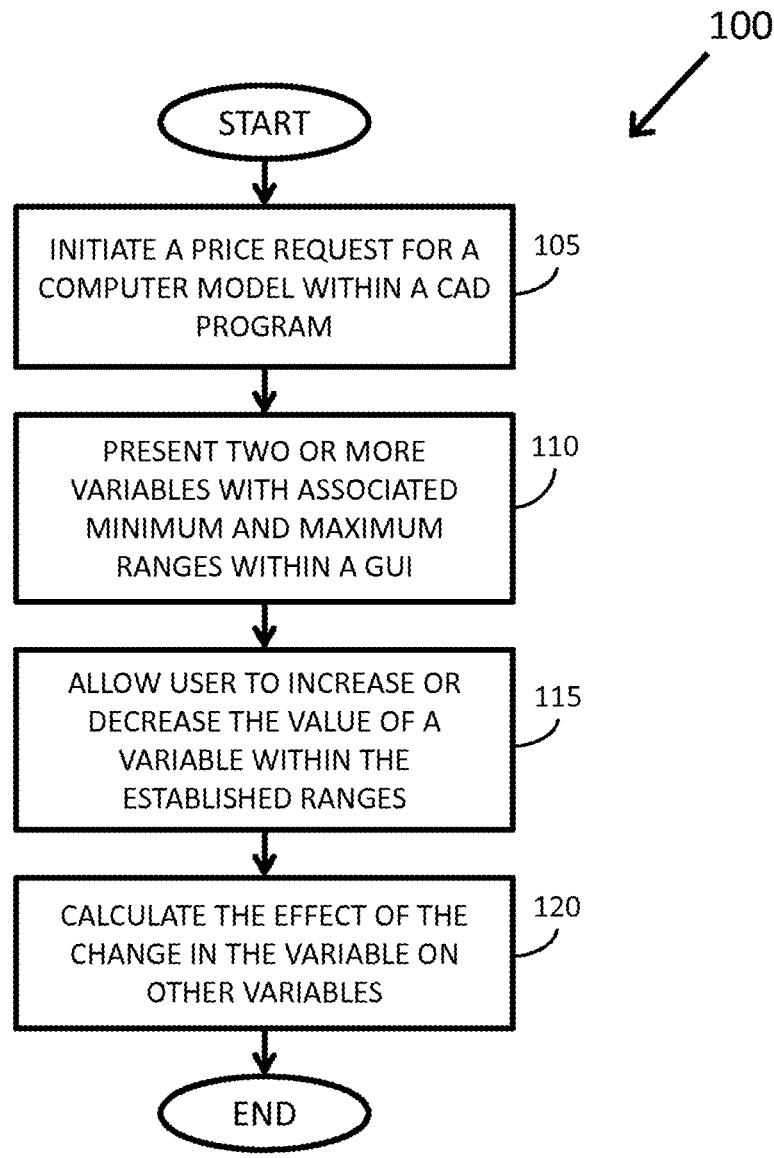
FIG. 1 is a flowchart illustrating an exemplary method of providing pricing for one or more instantiations of a structure defined in a three-dimensional (3D) computer model.

FIG. 1 provides a high-level flowchart of the operation of a first embodiment of the present disclosure. While an embodiment of the present disclosure will be described in further detail below, this high-level description is provided for ease of understanding. Pursuant to process 100, in step 105 one or more components of a system, such as one or more of the systems described hereinbelow, may receive a price request directed to one or more suppliers for an initial price for a structure defined in a 3D computer model from a user. In step 110, a graphical user interface (GUI) may be presented to the user that displays two or more business variables. Here, "business variables" means any sort of variable associated with the manufacture of products that often affect one or more other variables. Since these variables often affect the ultimate price of the ordered product, they may also be referred to as "pricing variables," though it is not mandatory that only variables that affect price be used as business variables. Solely by way of example and not limitation, pricing or business variables may include lead time and delivery time. If the user wants a faster delivery time, that choice may affect price; conversely, if the user is only willing to pay a certain price, that decision may affect available delivery schedules. Business variables can also include quantity and quality. For example, if the user desires a particular quality level for a parameter associated with the product itself (such as a coarse "as-is" finish versus fine polishing), that may affect price as well as delivery schedules. Of course, the desired quantity may affect the other variables; for example, as the requested quantity increases, the delivery schedule may need to be extended and/or the pricing, either per-part and/or overall, may need to be reduced. Therefore, as a practical matter, business variables may include any variables associated with a product, ones of which may affect other variables pertaining to aspects of the manufactured product itself optionally as well as the business terms associated with supplying that product.

As shown in step 110, in an embodiment of the present disclosure, the variables may be displayed to a user along with specified minimums and maximums (for variables that can be numerically expressed) or specified values (for variables that are otherwise expressed). So, while price, quantity, and delivery schedules can be expressed as associated numerical minimum and maximum values, a quality variable such as degree of polishing would be listed as particular available options. In an embodiment of the present disclosure, as will be described further below, minimums and maximums are set by the supplier using a variety of techniques. For example, maximum quantity may be able to be determined as a function of total manufacturing capacity per unit time. Minimum price may be set at a price that would allow the supplier to make a minimum profit given a particular set of starting materials and the types and number of manufacturing steps required. Note that the minimums and maximums of different variables can be related to one another. So, for example, when the supplier determines the maximum quantity of products it can produce in a set amount of time, that quantity may have an associated minimum or maximum delivery schedule and/or an associated minimum price.

In step 115, the user may interact with the GUI display of at least two business variables, to set at least one of those variables to a particular value. In some embodiments, such a value may need to be within a predetermined and/or dynamically updated minimum and maximum for that value. In step 120, one or more components of one or more systems described further hereinbelow may then determine how the changed value for the variable in question alters other values of other business variables and/or prices, as well as any minimums and maximums associated with those variables, and the result may be displayed on the GUI. In that manner, the user can optimize the tradeoffs between business variables and prices in order to maximize the value they receive for the manufacture of the goods in question by the supplier.

Figure 2:
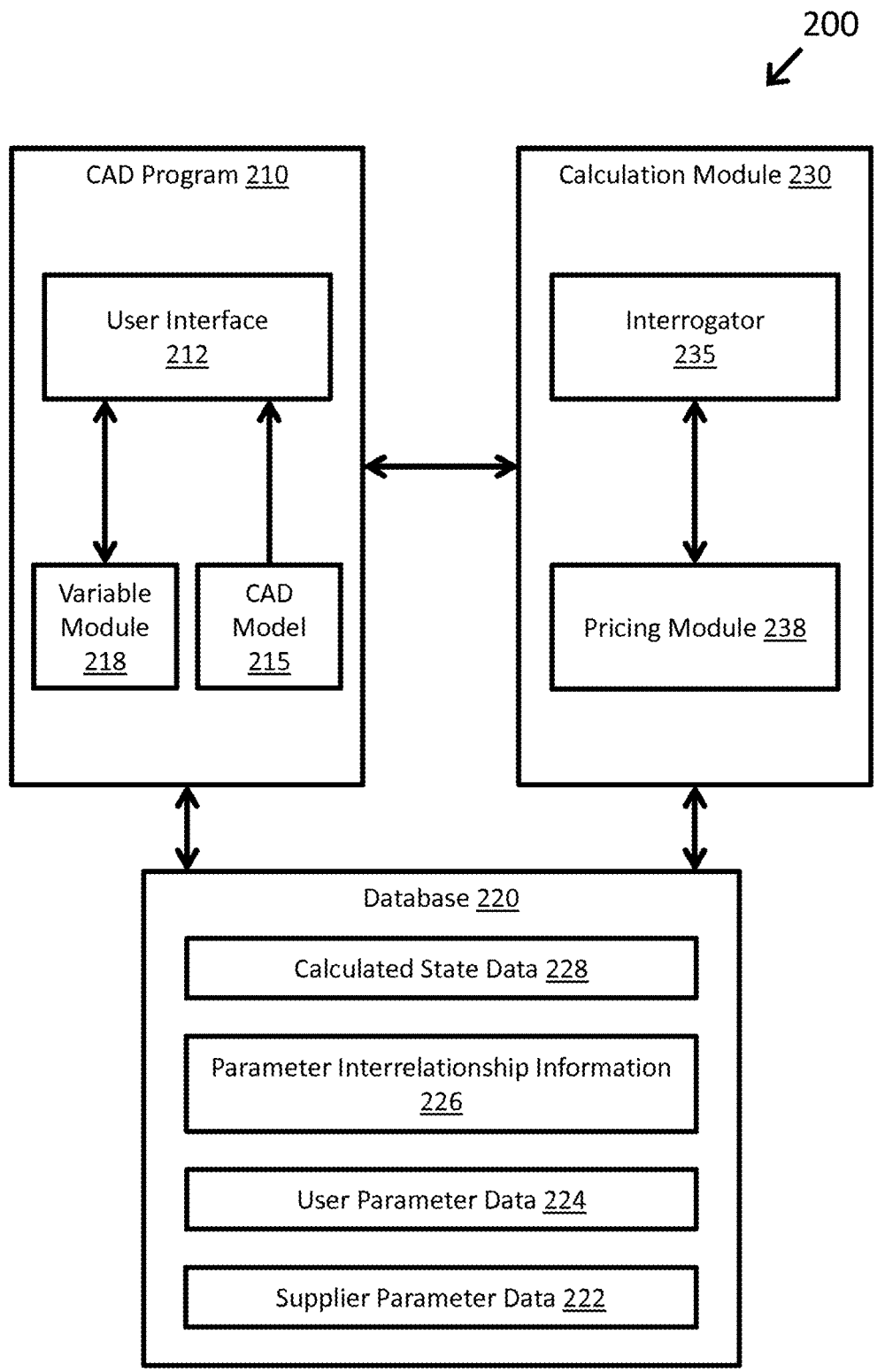
FIG. 2 is a block diagram of a computer control system that can be used to implement the method of FIG. 1.

With reference now to FIG. 2, a block diagram of a system of the present disclosure 200 is shown, various portions of which may be implemented in software. In the description to follow, reference is made to "blocks" of computer program code, or modules of code. It is to be understood that the reference to separate "modules" is for ease of illustration and discussion. As a practical matter, the program code instantiating the present disclosure could be organized in any one of a number of well-known manners to provide the functions described. While it is possible that separate code modules could be created to achieve the separate functions described, that is not required. So while various modules of the program of the present disclosure are described separately, in practice the actual modules of code instantiating the functions described for those separate modules could be intermingled . . . they do not have to be separate and independent sequences of code.

As shown in FIG. 2, a system usable to implement one or more aspects of the present disclosure may include a CAD program 210, a database 220, and a calculation module 230. In the CAD program 210, user inputs and screen displays to enable those inputs may be provided by a GUI. In practice, the GUI may be associated with a computer through which the user accesses a CAD program. However, the GUI can be hosted by any computer system that can receive user inputs, ranging from a cellphone up to a server system, among others. The CAD program 210 may include functionality like that of three-dimensional (3D) CAD programs known in the prior art usable to create a 3D computer model 215 of a product design. The CAD program 210 may also include a variable module 218, which may monitor user inputs from the GUI and may set the business variables and prices referred to above to initial values and may monitor any changes to those business variables and/or prices as made by the user via the GUI or otherwise. The variable module 218 may write the values of those business variables and/or prices to database 220 and provide them to a calculation module like calculation module 230 that may apply changes to the other related business variables and/or prices that result from changes to the business variables and/or prices selected and changed by the user at the GUI.

The database 220 may comprise any database that can provide the organization of information set forth below. In an embodiment of the present disclosure, the database 220 may include supplier parameter data 222, user parameter data 224, parameter interrelationship information 226, and calculated state data 228. The supplier parameter data 222 may be supplied by a supplier and may include given ranges of business variables (or parameters) and/or prices associated with the product to be manufactured and/or other information associated with the supplier. As discussed above, supplier parameter data 222 can include the minimum and maximum ranges of price, quantity, and delivery schedules. It can also include non-numeric data such as its capability to provide a desired product attribute, such as a certain level of polishing. In some embodiments, this information may be provided by the supplier as part of the initial and/or continuing configuration of the system; however, the present disclosure is not so limited—the information could be provided on-demand during operation of one or more systems of the present disclosure. Supplier parameter data 222 may also include one or more of: information such as name and location; data from which supplier prices may be calculated by the pricing modules discussed below (such as one or more labor costs, set-up costs, shipping costs, and/or other supplier pricing data) or overall prices associated with specific products, specific processes, or specified product components; and/or other information reflecting the manufacturing capabilities of the supplier, such as polishing/finishing options. Supplier parameter data 222 may further include supplier scheduling information or be communicatively connected to a suppliers enterprise resource planning (ERP) system, which may include an application programming interface (API) that can work with other software easily. ERP systems are well known, and a person of reasonable skill in the art will readily appreciate the plethora of ERP systems that could provide scheduling information.

In an embodiment, supplier scheduling information is a variable that affects minimum and maximum values of price and lead time. It is noted that supplier scheduling information may also affect other variables. User parameter data 224 may include some or all of the respective values of the respective parameters set by a user. In some embodiments, this data may include a running log of which parameters were initially set by the user to obtain the initial price and related information from the supplier (the description of which is set forth below with reference to calculation module 230), as well as which parameters were modified by the user and the respective values of those parameters as modified and/or past or final values of any other affected, related, or unrelated parameters. Such a log may be useful to suppliers, as it may help to inform them of which prices and/or business variables are most important to an individual user, all users, and/or a particular subset of users. Further, such a log may be useful for any number of other purposes. In some embodiments, a separate log may be used for each user or subset of users and a separate log may be used for different sets of parameters (e.g., initial values, modified values, final values, etc.). One or more of these logs may be provided to one or more users, suppliers, or other entities, as desired.

The parameter interrelationship information 226 may include interrelationships between various pairs of business variables and/or prices. For example, this information may include relationships between price, quantity, and delivery time. By way of example, for a quantity of 1,000 units of a sheet metal drawer, the price may be $5 per unit and the default delivery time may be 12 weeks. If a user wants a faster delivery time, price may increase by ($400 plus (X squared)($100)) for every week X delivery schedule is expedited, such that the price for 1,000 units increases by $500 for one week advance delivery compared to standard delivery time or $800 for two weeks advance delivery of reduced delivery compared to standard delivery time. Another example is the relationship between price and quantity. By way of example, as the number of units requested increases from 100 to 1,000 (a factor of 10), price may decrease from $15/unit to $5/unit (a factor of 3). In yet another example, a relationship may be specified between quantity and lead time. By way of example, as the number of units requested increases from 100 to 1,000 (a factor of 10), lead time may increase from 6 to 12 weeks (a factor of 2). As will be readily apparent to a person of skill in the art, other relationships between these and other variables can be specified.

As a practical matter the supplier parameter data 222 and the parameter interrelationship information 226 may be applicable to particular types of products and may change depending on the type of product. For example, one set of data 224 and information 226 may apply to sheet metal products and a different set of data 222 and information 224 may apply to plastic products. Additionally or alternatively, some of the data 222 and information 226 may be common to different types of products. Further additionally or alternatively, parameter interrelationship information 226 may be determined as a function of one or more 3D computer models, as parameters may interrelate differently depending on characteristics of particular 3D computer models. For example, manufacturing one or more products corresponding to a 3D computer model defining a particularly large structure may require more lead time than a 3D computer model defining an identically shaped but significantly smaller structure for the same quantity; thus, in this example, the larger structure may cause the parameter interrelationship information to specify a different relationship between quantity and lead time than might be specified for the smaller structure. As such, in some embodiments, the parameter interrelationship information 226 may be specified in terms of variables that can be interrogated from a 3D computer model (e.g., dimensions, tolerances, etc.) and/or read or derived from supplier parameter data 222; additionally or alternatively, in some embodiments the parameter interrelationship information may be calculated and/or determined as needed as a function of particular 3D computer models and/or supplier parameter data. Database 220 may further include calculated state data 228. For each change to one or more business variables and/or prices that are made by the user that are written to user parameter data 224 by the variable module 218, the resultant information may be recorded in the calculated state data 228. Related calculations are discussed further herein below.

The calculation module 230 may include an interrogator 235 and a pricing module 238. The interrogator 235 may interrogate, or parse/analyze, the data from the 3D computer model 215, to identify components, processes, or other identifiable parts of the 3D computer model that may be used by pricing module 238 to generate a calculated price for manufacturing a structure defined by the 3D computer model under analysis. By way of example, if the 3D computer model 215 indicates that the product will require N number of drilled holes in a 0.25 inch thick aluminum sheet, the calculation module 230 may pull associated prices from the supplier parameter data 222 (in this example, it would pull prices such as X for drill set up time, Y for drilling per tenth of an inch into aluminum) and the calculation module 230 would determine a price (e.g., (N×X)+(Y×2.5×N)). Illustrative embodiments for such an interrogator 235, as well as the associated pricing module 238, may be found in: U.S. patent application Ser. No. 14/060,033, filed on Oct. 22, 2013, and titled "AUTOMATED FABRICATION PRICE QUOTING AND FABRICATION ORDERING FOR COMPUTER-MODELED STRUCTURES," which is incorporated by reference herein for its teachings of extracting pricing data from computer models; U.S. patent application Ser. No. 14/282,773, filed on May 20, 2014, and titled "METHODS AND SOFTWARE FOR ENABLING CUSTOM PRICING IN AN ELECTRONIC COMMERCE SYSTEM," which is incorporated by reference herein for its teachings of particular interrogator engines; and U.S. Patent Application Ser. No. 62/072,653, filed on Oct. 30, 2014, and titled "METHODS AND SOFTWARE FOR FACILITATING PRICING AND ORDERING OF A STRUCTURE REPRESENTED IN A COMPUTER MODEL," which is incorporated by reference herein for its teachings of various interrogation engines and related functionality.

In some embodiments, an interrogator, such as interrogator 235, may parse a 3D computer model to identify separate elements thereof by reading a combination of (a) specific commands issued by a CAD system and (b) specific routines or functions associated with such commands to determine whether they collectively define an individual element or portion (a "shape," "solid body," or "component") of a 3D computer model. Many CAD systems, including, by way of example, SolidWorks® (registered trademark of Dassault Systemes), include an API to enable a user to control the issuance of customized routines or functions associated with such commands. Interrogator 235 may read such commands, routines, and functions to determine whether they define an individual shape, and, if so, may analyze various geometric aspects of the defined shape to determine whether such aspects correspond to one or more manufacturing requirements for a product to be manufactured based on a 3D computer model. If so, such requirements may be output from interrogator 235 as CAD data or interrogation data for processing and analysis by any one or more components of the present disclosure.

As a first step, interrogator 235 may identify discrete shapes in a 3D computer model. In an embodiment based on the SolidWorks CAD program, interrogator 235 may read the "FeatureManager Design Tree" (an outline representation of individual shapes) to determine the number of solid bodies (or shapes) in the design. Representations of individual shapes may be found in other CAD software files, and other CAD software systems may be used. In SolidWorks, one command usable to analyze the number of solid bodies is:

object[ ] bodies=(object[ ])part.GetBodies2((int)Const.sw-BodyType_e.swSolidBody, false);

and the output is a list of bodies. The foregoing code statement is listed by way of example only; other code statements or sequences could be used.

Interrogator 235 may then analyze geometric aspects of such identified shapes and compare such aspects to corresponding manufacturing requirements. In an embodiment, these manufacturing requirements may include given starting materials. In other words, interrogator 235 may determine whether a given defined shape can be manufactured from a given starting material, based on one or more analyzed geometric properties of one or more identified shapes. If so, that starting material may be identified as a manufacturing requirement and may be included in CAD data generated by interrogator 235. As a result, a pricing module, such as pricing module 238, may read prices associated with such starting materials from a supplier database or other location to determine a given supplier's calculated price per unit for a product to be manufactured in accordance with such 3D computer model.

In an embodiment, interrogator 235 may determine whether a defined shape may be manufactured from a sheet metal part. In general, in order to be manufactured from sheet metal, a defined shape must have a uniform thickness. As will be apparent to a person of skill in the art, other geometric attributes may be analyzed to determine potential manufacturing requirements. By way of example, a given angle of bend may preclude use of certain starting materials. A given dimensional measurement may preclude certain starting materials. In an alternate embodiment, different geometric properties may be compared in combination to define manufacturing requirements. For example, a given shape may have a uniform thickness (such that it could be manufactured from two different types of sheet metal, such as copper or aluminum), be 0.50" thick, and include bends of over 45 degrees (which may preclude the use of a copper sheet, because various types of copper, depending, on composition, may not be bendable at 45° at a 0.50" thickness).

In some embodiments, in order to determine whether a given shape has a uniform thickness, interrogator 235 may first execute the "GetBoundingBox" SolidWorks API command. The resulting output may be an array of X, Y and Z extents, for example:

XCorner1, YCorner1, ZCorner1

XCorner2, YCorner2,

ZCorner2

In some embodiments, a part may not be oriented so that its thickness is represented by the Z dimension (i.e., the part is lying flat) but instead by a X or Y dimension. This may be the case where interrogator 235 needs to determine whether sheet metal can be used to fabricate the part. However, if interrogator 235 analyzes the x-y plane, then it may not be able to reliably identify each portion of the part that can be fabricated from sheet metal; by also analyzing the z dimension, the interrogator may reliably identify all sheet metal parts. Interrogator may determine which dimension represents thickness by determining distance between corners. Thickness may be represented by the shortest distance, as follows:

$$\text{abs}[X\text{Corner1}-X\text{Corner2}]=\text{Variable } X \quad \text{abs}[Y\text{Corner1}-Y\text{Corner2}]=\text{Variable } Y \quad \text{abs}[Z\text{Corner1}-Z\text{Corner2}]=\text{Variable } Z$$

For this example, if Variable X has the lowest value of the three results, it may represent the thickness of a 3D computer model. If that is the case, width and length of the 3D computer model may then be calculated as Width=abs[YCorner1−YCorner2]

Length=abs[ZCorner1−ZCorner2]

Given these calculations, interrogator 235 may determine that a workpiece has a uniform thickness if all of the following statements are true: the 3D computer model must have at least one solid body; all of the vertexes of the solid body faces that are perpendicular to the base plane are also equal to the thickness value (Variable X in this example); no vertex edge length is less than the thickness value; and the perimeter of the top face is equal to the perimeter of the bottom face. This may be determined through the following code, which finds the perimeter for each face. The values of the faces are then compared and if they are equal, the output is true.

```
double
getPerimeter(IFace2face)
var edges=face.GetEdges( )as
object[ ];
double perimeter=0;
foreach (IEdge edge in edges)
if (edge !=null)
perimeter+=
edge.GetLength(SwApp);
return perimeter;
}
```

The foregoing code statements are listed by way of example only; other code statements or sequences could be used. If the results are all true, the analyzed shape of the 3D computer model may represent a workpiece of uniform thickness. As such, interrogator 235 may conclude that the analyzed shape may be fabricated from a single sheet metal part. Accordingly, by way of example, "sheet metal" may be included in CAD data as a manufacturing requirement, which may cause a pricing module to read prices for sheet metal parts (versus prices for plastics or other materials) from a supplier database or elsewhere. As a result, a pricing module may determine a given supplier's calculated price per unit for a product to be manufactured in accordance with such manufacturing constraints as automatedly determined by interrogator 235.

The "uniform thickness" determination set forth above, as well as the attendant height, length, and thickness measurements, may be used to enable other comparisons between manufacturing requirements and supplier attributes. For example, once the use of a sheet metal workpiece has been confirmed as set forth above, a capabilities engine may query stored supplier data for any one of length, width, thickness, or any other supplier constraints for sheet metal parts. An example of a potential supplier constraint that would be determined by the nature of the starting workpiece material is as follows. For mechanical forming of sheet metal parts, a press brake may form predetermined bends in a workpiece by clamping it between a matching punch and a die. A press brake may include a bed for supporting the workpiece between the punch and the die. However, press brakes cannot typically bend parts longer than the length of the bed. If a given supplier uses a press brake having a maximum bed length of eight feet, utilizing the process as set forth above, interrogator 235 may determine that a defined shape of a 3D computer model has a length of ten feet. In this case, a pricing module may not calculate pricing for that supplier because that supplier is unable to meet one of the manufacturing requirements imposed by the 3D computer model. Calculation module 230 may use outputs from interrogator 235 to determine a price and/or to derive a portion of parameter interrelationship information 226, as described herein.

3D computer models typically contain a plethora of data but typically do not store the data in such a way that pricing information can be derived directly therefrom. To cure this deficiency, interrogator 235 can pull data (e.g., material type) from the 3D computer model and may provide it to a pricing engine such as pricing module 238, reformat the data for the pricing module 238 and then provide the reformatted data to the pricing module 238, and/or interpret the data into new data specific for the pricing module 238 and then provide the new data to the pricing module 238. Accordingly, the pricing module 238 may use specific data in specific formats in formulas to calculate pricing.

Interpreting data into new data may involve one or more of any number of functions and/or operations. For example, for a sheet metal part, a 3D computer model may include a variety of information regarding a bend. However, it is useful for a pricing engine to have access to information specifying how many unique bends there are with different bend lengths and the quantity of bends for each unique bend length. To determine such information, interrogator 235 may query each bend in the 3D computer model, establish a table of bend lengths, and determine a sum of bend lengths, for example, for each bend of a common bend length. This can be important for the pricing module 238 because each unique bend length involves a certain amount of set-up time and therefore a different price. In the case of ten bends all of the same bend length, there may only be one set-up charge applied. In the case of ten bends each with a unique bend length, there might be ten set-up charges applied, depending upon the algorithms of the pricing engine.

Another sheet metal example is "Hole Too Close To An Edge" (HOLE). CAD programs and 3D computer models typically do not store this information in the 3D computer model. However, a HOLE can cause manufacturing issues (e.g., it can deform surrounding material and, in the case of a diameter, the diameter may become oblong) if it is, for example, less than four times the material thickness away from the bend. Therefore interrogator 235 can be programed to check the distance from any hole to the closest bend, divide it by the material and create a true/false flag as a function of the result. The true/false flag can then trigger pricing module 238 to calculate the price differently than it might otherwise.

Yet another sheet metal example is that a punched hole diameter typically needs to be the same or greater than the material thickness. If it is not, a second operation may be required to manufacture the hole, resulting in more time spent to create the hole than if it could simply be punched. Interrogator 235 may be programmed to check for this situation and create a true/false flag depending upon the result. Pricing module 238 may then utilize this true/false flag in determining a price, whereas without such a true/false flag the pricing engine may underprice or overprice holes with a diameter less than the material thickness of the associated material.

A generic example that would be relevant to such processes as sheet metal, machining, and injection molding is whether a hole extends through a part or only extends partially into the part. The result may affect manufacturing costs, as, for example, a non-through hole in sheet metal requires another operation (e.g., machining) to create the hole. CAD programs and 3D computer models may not specify whether or not a hole extends through associated material. In some CAD programs, given a sheet with a thickness, to put a hole in the sheet, a user may create a cylinder and define one or more Boolean operations to subtract the cylinder from the sheet; under these conditions, there may not be any explicit information in the 3D computer model regarding whether the hole extends through the sheet. In this case, interrogator 235 can be programmed to analyze the maximum material thickness for the hole and compare it to the geometry modeled to cut the hole, creating a resultant true/false flag that may be utilized by pricing module 238 in determining a price.

Figure 3:
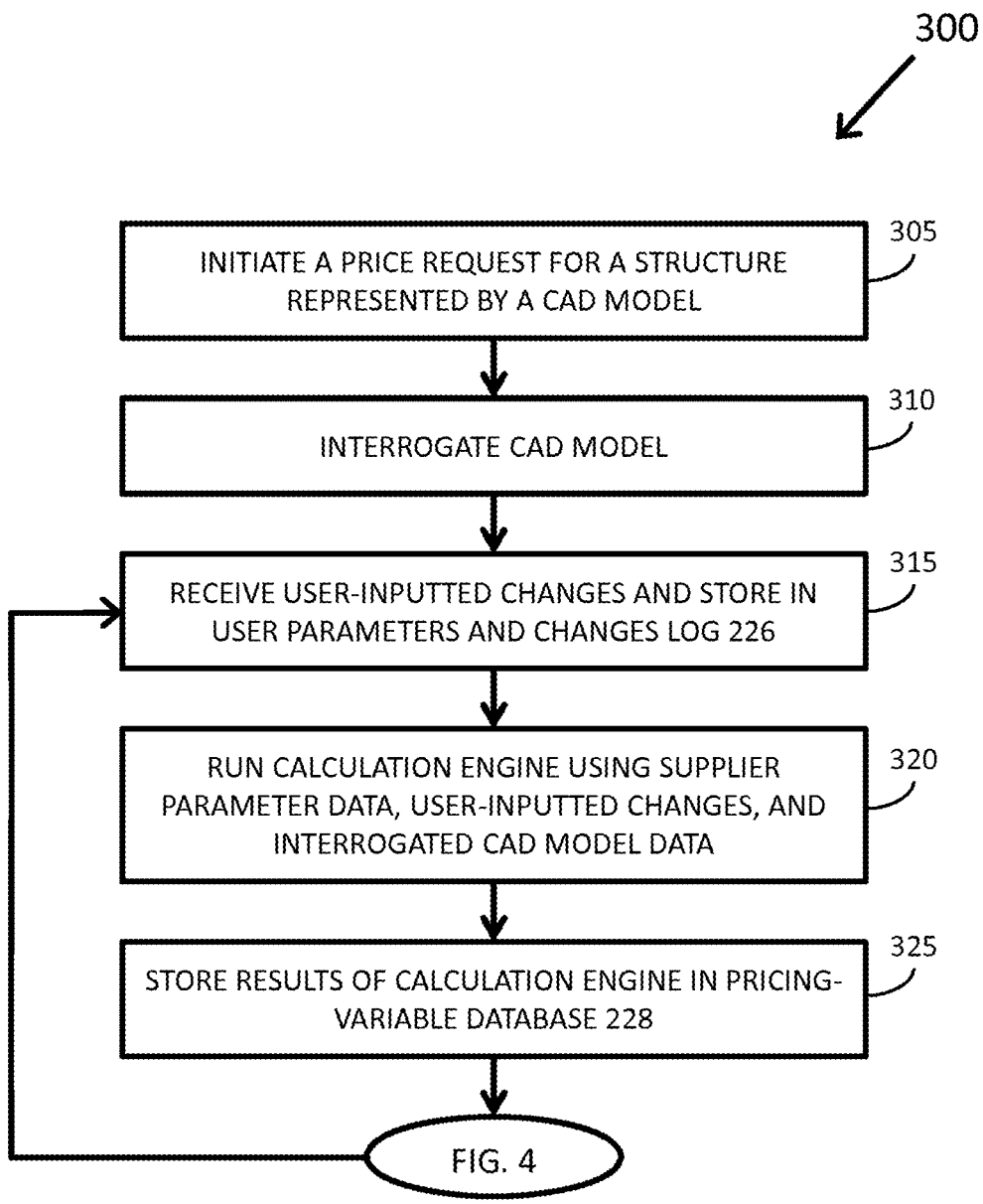
FIG. 3 is a flowchart illustrating various steps that may be performed in the context of the method of FIG. 1 in accordance with an embodiment of the present disclosure.

FIG. 3 illustrates a detailed method 300 according to aspects of the present disclosure, which is discussed with reference to various components of the system 200 of FIG. 2. As a user interacts with the CAD program 210 of FIG. 2 via a GUI or other interface, the user may initiate a price request for the 3D computer model 215 at step 305. Continuing with method 300, in step 310 the interrogator 235 may analyze the 3D computer model 215 to identify attributes, parts, operations, and processes, among other aspects, required to manufacture the designed product. Then, in step 315, user inputs from the GUI may be provided via the variable module 218 to the user parameter data 224 of database 220. For example, the user may indicate that they want 1,000 units of a product defined by the 3D computer model 215. That input may be sent by variable module 218 to the user parameter data 224 so that an entry therein corresponding to quantity may be set at 1,000. Then in step 320, the calculation module may take the output from interrogator 235, the supplier parameter data 222, the user parameter data 224, and the parameter interrelationship information 226 to determine (i) a range of permitted values for selected business values (such as quantity and delivery schedule) and (ii) associated price. The calculation of (i) may be primarily based on supplier parameter data 222 and parameter interrelationship information 226, while the calculation of (ii) may be primarily based on a comparison of the output of interrogator 235 and the supplier parameter data 222, with the user parameter data 224 providing inputs such as requested quantities. Note that price would be calculated primarily by pricing module 238, as described and illustrated in the patent applications set forth above.

The following example is provided to enable a clearer understanding of these operations. The interrogator 235 analyzes the 3D computer model 215 for, e.g., a simple box made of sheet metal with four sides and a bottom made of metal and a top made of plastic. It determines that one cutting process is needed (to define the sides and bottom of the box) that costs $A/unit; one molding process is needed (for the plastic top); four bending processes are needed (to bend the sheet metal workpiece into a box), each bend costing $B/bend; four drilling processes are needed (for hinges), each costing $C/drill; and two joining processes are needed, to join the hinges to the sides of the box and the plastic top, each costing $D/join process. The pricing module 238 may then determine that each unit would cost, for example, $A+$4B+$4C+$2D, plus the cost of the materials for the base sheet metal and plastic top, per unit. The calculation unit may then determine the price for the user request of 1,000 units that came from user parameter data 224, as well as calculate the overall minimum and maximum ranges for business variables reflected by the supplier parameter data 222 and the parameter interrelationship information 226 given the 1,000 quantity input from user parameter data 224 and the price data from pricing module 238, and would store that resultant in the calculated state data table 228.

Figure 4:
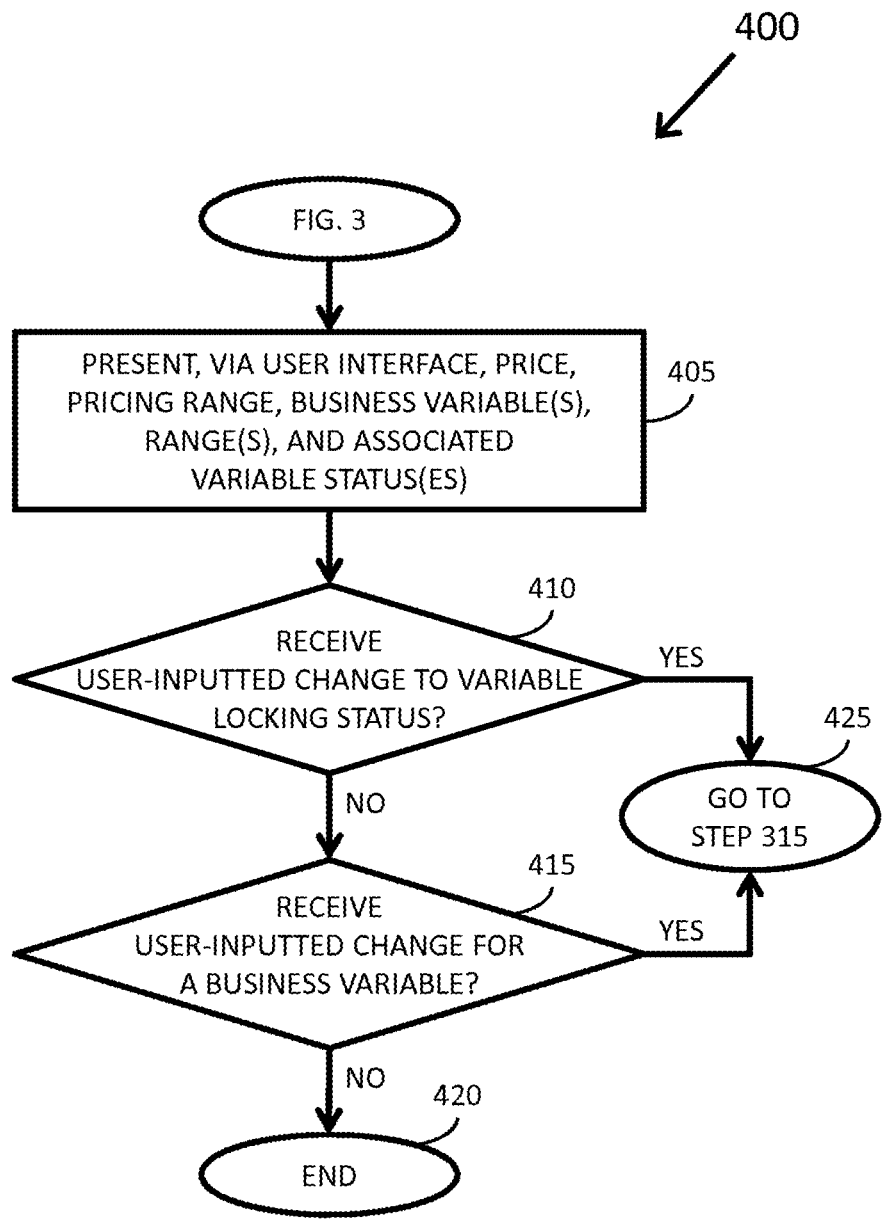
FIG. 4 is a flowchart illustrating various further steps that may be performed in the context of the method of FIG. 1 in accordance with an embodiment of the present disclosure.

FIG. 4 depicts steps of a method 400, which may be performed subsequent to step 325 of method 300 in FIG. 3. In step 405, one or more components of one or more systems disclosed herein may present the foregoing data that populates the calculated state data table 228 or a subset thereof to the user via GUI 212. The display to the user in step 405 can occur before, during, or after that same data is written to the calculated state data table 228 in step 325 of FIG. 3. From a data stability standpoint, it may be preferable for this data be provided to the GUI 212 from the calculated state data table 228. For the sake of clarity, the data stored at this step, when it first occurs in the process, may be the data from the calculated state data table 228 for the initially determined price(s) and associated business variables. The data may include the currently calculated price, optionally along with a range of allowable values from minimum (or "min") to maximum (or "max"). The data displayed may also include one or more business variables (e.g., quantity and lead time) along with their associated allowable values within stated min and max values. The data provided at step 405 may additionally or alternatively include "variable status" specifications. In each calculation, given business variables and/or prices may be designated as "open" or "locked." If the user designates a particular variable as "locked" for the purpose of that particular calculation, that variable may be set at a particular value or limited to a narrower range of variation than may otherwise be allowed. On the other hand, if a given variable is designated by the user as "open" or "unlocked," then that variable may automatedly change, or change more drastically, in value as a result of the calculation. By way of example, if a user decides they want to order 1,000 units, that may be considered the single most important criterion for a given calculation. So, in one embodiment, the "units" variable may be designated as "locked" and the remaining variables may be designated as "open" or "unlocked" so that they can vary as a function of the calculations.

In step 410, a user input to GUI 212 to reset a given business variable or price from "unlocked" to "locked," or from "locked" to "unlocked," is determined. If a change has occurred, the process may jump from step 425 in FIG. 4 to step 315 of FIG. 3 and one or more components of one or more systems of the present disclosure may repeat steps 315-325 of FIG. 3 to determine and, if necessary, implement any changes to the allowable ranges and/or values of business variables and/or prices resulting from the status of a given business variable and/or price changing between "locked" and "unlocked." Results of such a determination may be provided to the user in step 405 of FIG. 4. This process may repeat until the user has completed changing the locked/unlocked status and/or values of variables. If the lock status of business variables and prices are not changed, the process may continue to step 415. Note that while this embodiment of the present disclosure has been described with reference to recalculating the permitted ranges of business variables and values of prices as the locked/unlocked status of each variable changes, in some embodiments these calculations may occur in a "batch" mode, such that once a user sets or resets all the locked/unlocked variable settings for a given calculation, results may be determined in a single cycle or "batch" of calculations, rather than in such a "real-time" mode (e.g., multiple cycles per status change).

In step 415, the user may input a change to one of the business variables and/or prices. If no change is made, or the user otherwise indicates that they have finalized their inputs (e.g., via a "finalize" button or other user interface element), the process may terminate at step 420. If a user makes a change to one or more of the displayed business variables and/or prices, in step 425 the process may continue to step 315 of FIG. 3 and repeat steps 315-325 of FIG. 3 and steps 405-415 of FIG. 4 until no further changes are made to the business variables and/or prices or to their locked/unlocked status or the user otherwise indicates that they wish to stop the process. While not shown in FIG. 4, the user may wish to stop this process because they have the price, quantity, delivery time, and/or other business variables associated with the potential production or supply deal finalized, in which case they may then generate an order to a supplier based on some or all of such optimized business variables and/or prices and/or transmit an order to the supplier.

FIG. 5 presents an example of the data stored in calculated state data table 228 for each iteration of changes to business variables by the user. In the table, the rows labeled "State 1," "State 2", and "State 3" are for respective iterations for different values of different variables. State 1 is the initial state of the variables, reflecting the process as initially run in FIG. 3 to step 325 when the user initially requests a base price for a product manufactured in accordance with the 3D computer model 215. Note that it is during this initial calculation that the data listed in the row "Minimums and Maximums" is calculated, indicating the overall (or base) mins and maxes for each business variable and price listed (quantity, lead time, total price, and price per unit). Within each row "State 1" through "State 3," there are two sub-rows. The upper sub-row labeled "Value" indicates the particular value for the business variable or price in accordance with that calculation; the lower sub-row labeled "Lock Status" indicates for that given calculation whether that variable was locked or unlocked. As shown, as might be expected, in the initial calculation during which a base price is determined, none of the variables were in "lock" status, therefore they are all designated "unlocked."

Accordingly, in this particular example of the operation of an embodiment of the present disclosure, when in step 305 of FIG. 3 a user requests an initial (or base) price, the calculation module may determine a range of permitted values for selected business variables (as a function of corresponding data in supplier parameter data table 222) and write those to calculated state data table 228 as entries to the "Minimums and Maximums" row shown in FIG. 5. The calculation module may then determine the base values of the business variables of quantity and lead time (as indicated by supplier parameter data table 222) as well as price for the type of product and associated manufacturing requirements (as indicated by interrogator 235 and pricing module 238) and/or write those to calculated state data table 228, e.g., as entries to the "Value" sub-row of the State 1 row of FIG. 5.

Figure 6A:
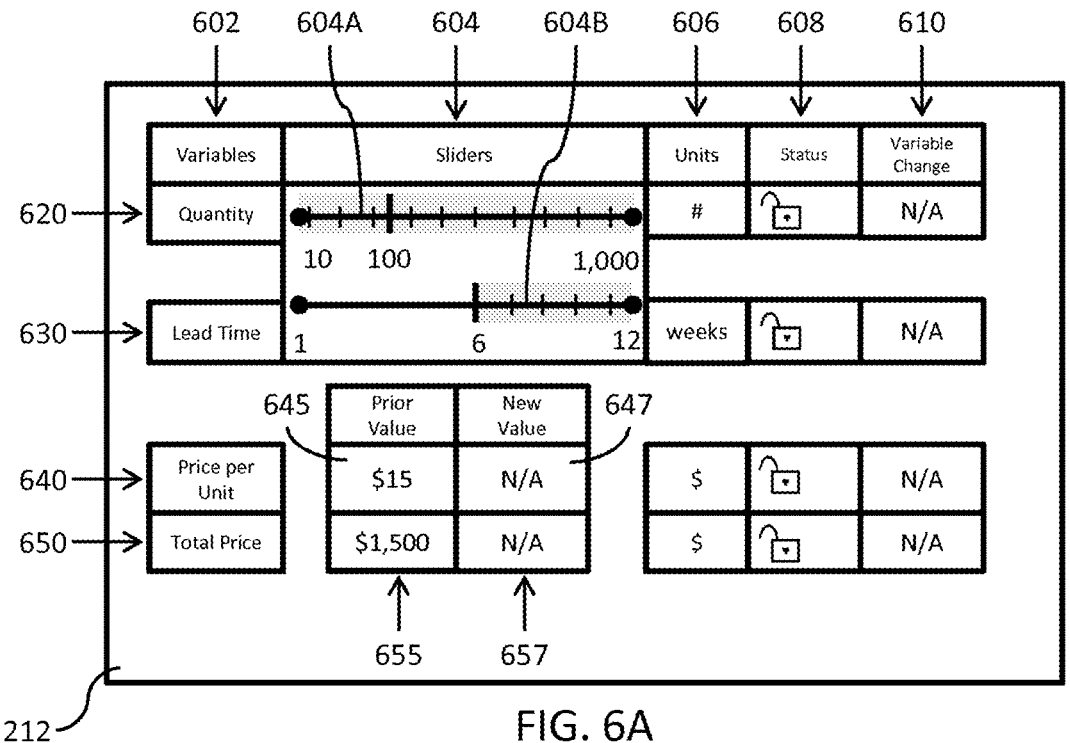
FIGS. 6A and 6B are exemplary user interface displays of State 1 and State 2 of FIG. 5.

Referring now to FIG. 6A, a schematic representation of an exemplary display to a user from step 405 of FIG. 4 is depicted, reflecting the data as listed for State 1. FIGS. 6 and 7 are highly schematic views of how a GUI might be implemented, at least in terms of the information depicted to a user. As will be readily apparent to a person of skill in the art, a variety of conventional techniques could be used to illustrate these functions in a different fashion. In FIG. 6A, the column 602 entitled "Variables" reflects the same variables listed in the top row of FIG. 5. Column 604 provides "sliders" that enable a user to set quantity and lead time within their respective ranges, which are indicated by the shaded bars within each slider. For example, the min of 10 and the max of 1,000 for the Quantity slider 604A is the same as was shown in FIG. 5. The initial quantity is set at 100 units, which again is the same as is shown in the "Value" entry in the "State 1" row of FIG. 5. Similarly, note that the Lead Time slider 604B is set at 6 weeks and can vary between 1 and 12 weeks, which are the same entries as the "Value" entry in State 1 and the "Minimums and Maximums" for Lead Time in FIG. 5.

The column of icons 606 in FIG. 6A indicates the units of measure for each row of variables, and the column of icons 608 indicates whether a given variable has been locked or unlocked (the icon in FIG. 6A indicates that all the variables are in an "unlocked" status). Finally, the column of icons 610 indicates the percentage change in the variable in question. In FIG. 6A, which indicates the status as of State 1 (initial price determination); no variables have been changed so the status for all the variables is indicated as "N/A" (not applicable).

In FIG. 6A, row 620 shows the status of the quantity business variable; row 630 shows the status of the lead time business variable; row 640 shows the status of the price per unit variable; and row 650 shows the status of the total price variable. The price per unit variable and the total price variable may be calculated together as part of the same equation or separately, as will be appreciated by those of ordinary skill in the art. Here, rather than using sliders such as 604, a "prior value" column 655 is provided, along with a "new value" column 657. Columns 655 and 657 are used to track changes to price as other variables change. In this case, column 655 reflects the current prices (price per unit and total price) initially determined during State 1. Note that these entries are the same as the entries in FIG. 5 for "Total Price" and "Price/unit" in the State 1 row. Column 657 in FIG. 6A indicates "N/A," because at this point no variables have been changed.

Figure 6B:
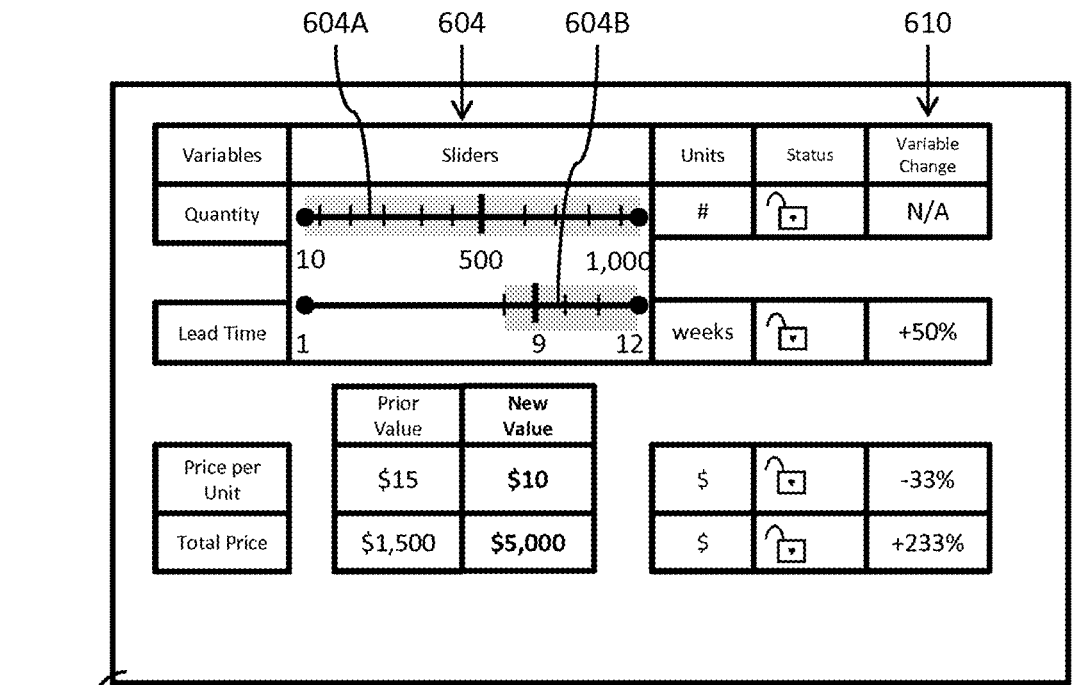

To provide an example of an embodiment of the present disclosure in operation, in State 2 the user modifies the quantity from 100 to 500 and optionally indicates that they would like see how that modification would affect other variables. The user input may be detected in step 415 of FIG. 4, and the process may continue at steps 315 and 320 to recalculate the variables in view of the user input. FIG. 5 illustrates the resulting status of the variables, as recorded in calculated state data table 228. The shadings in the respective boxes in the State 2 row indicate which variables were changed by the user (vertical hatching) and which changed as a result of the user changes (horizontal hatching); see the "legend" portion of FIG. 5. In this case, with a quantity increase from 100 units to 500 units, the minimum lead time increases from 6 weeks to 9 weeks, and the price per unit decreases from $15 to $10. Total price increases from $1500 to $5000. In step 405 of FIG. 4 this data is then presented to the user, such as shown in FIG. 6B. Note that column 610 illustrates the changes (in percentage) of the values of the variables in FIG. 6A as a result of the change in quantity initiated by the user.

Figure 7A:
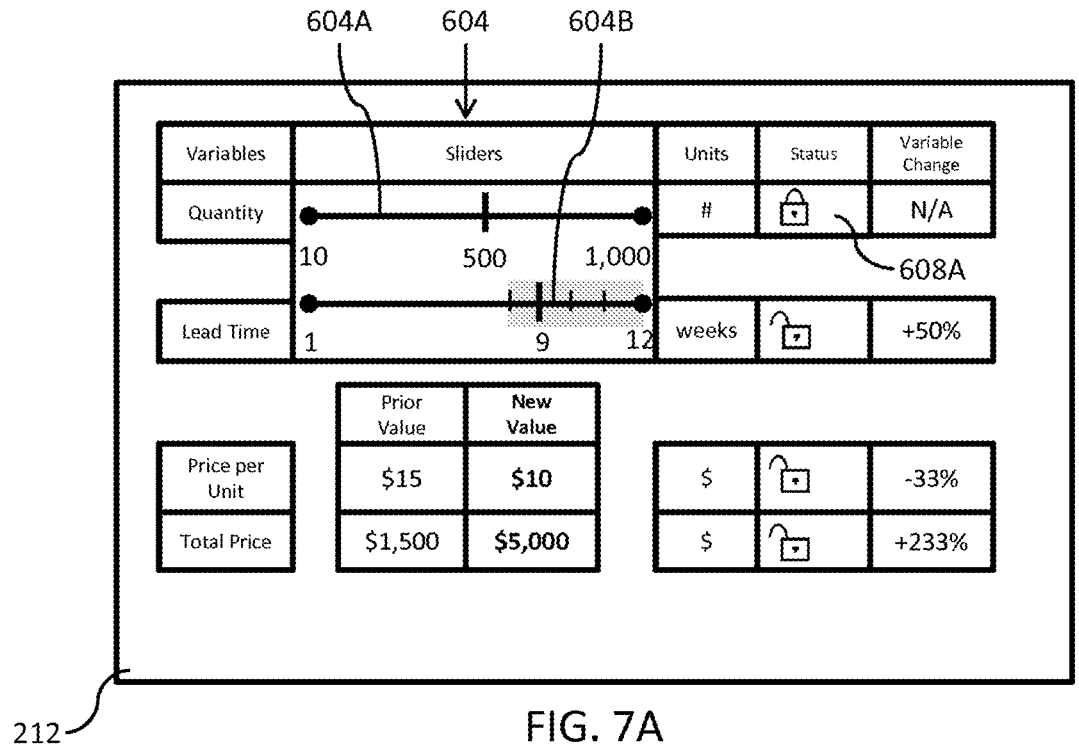
FIGS. 7A and 7B are exemplary user interface displays of State 3 of FIG. 5.
Figure 7B:
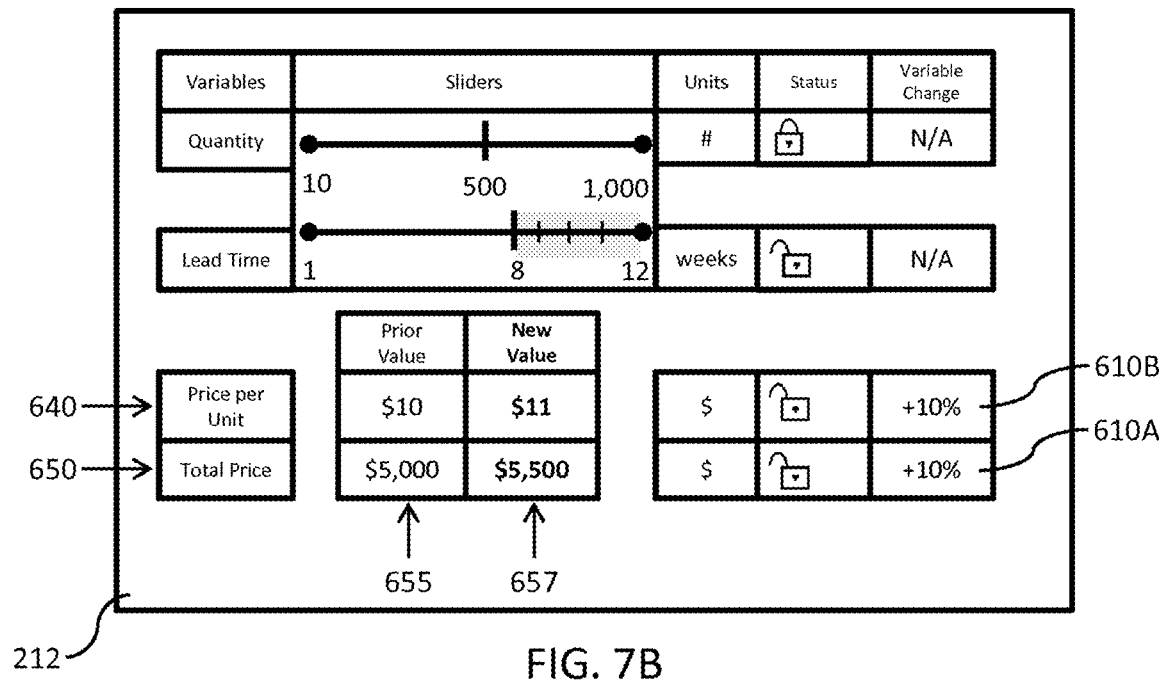

Next, as shown in FIG. 7A, the user may lock the quantity business variable, as indicated by the "locked" icon 608A, and the process may jump from step 410 (change in locked/unlocked status detected) through the recalculation of acceptable variable ranges in steps 315-325 in FIG. 3, with the results optionally displayed in step 405 to the user via a screen (see, e.g., FIG. 7A). Note what has happened to the sliders 604. In the lead time slider 604B, note that the min lead time has gone from one week to eight weeks, as indicated by the colored bar. As a result of the user action of locking in a new value, as detected in step 410 of FIG. 4, the calculations described above have been rerun and/or modified, and (in pertinent part) the parameter interrelationship information 226 for the supplier parameter data 222 may now indicate that for a quantity of 500 units, the minimum lead time to supply the product to the user is eight weeks.

Finally, pursuing the example, the user may wish to reduce the current lead time of nine weeks to the minimum allowable for a quantity of 500 units, which in this example is eight weeks. The user may render that change by moving the slider 604B from 9 to 8 (see FIG. 7B). With the other variables unlocked (aside from quantity), this user input would be detected in step 415 of FIG. 4, and the process may continue at step 315 and 320 to recalculate the unlocked business variables and/or prices in view of the user input. FIG. 5 illustrates the resulting status of the business variables and prices stored in the calculated state data table 228 and as shown in the "State 3" row in FIG. 5 as well as displayed to the user in FIG. 7B. Note that in pertinent part, with a decrease in lead time from nine weeks to eight, the total price increases from $5,000 to $5,500 (applying the relationship between quantity and lead time as stored in parameter interrelationship information table 226), which is displayed to the user at step 405 as the difference in the "Total Price" row 650 of FIG. 7B, and the respective entries in columns 655 and 657 (and with the corresponding 10% increase being indicated at 610A). As a further result, the price per unit increases from $10 to $11, which is displayed to the user at step 405 as the difference in the "Price Per Unit" row 640 of FIG. 7B, and the respective entries in columns 655 and 657 (and with the corresponding 10% increase being indicated at 610B).

Note the interactions of the values of the business variables and prices as a function of which is "locked" and which is not. Here, quantity was locked at 500 as lead time was decreased, meaning price increased. If, for example, a price had been locked instead, the value of the quantity business variable may have decreased with decreasing lead time. If both price and quantity had been locked, allowable lead time may have increased. In this manner, between setting and locking different combinations of business variables and prices, the user can optimize their business options/variables and prices in ordering a 3D computer modeled part for manufacture.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
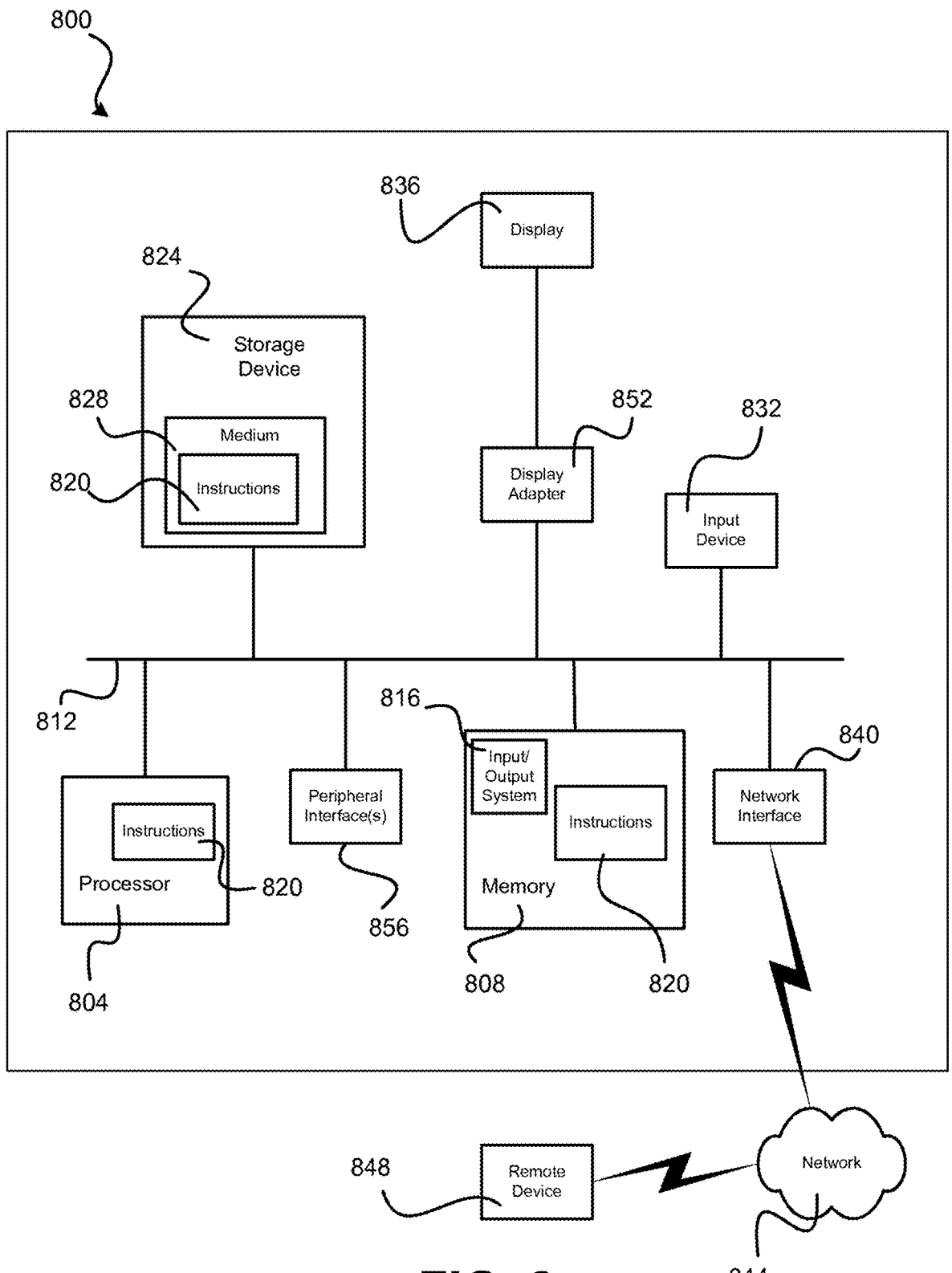
FIG. 8 is a block diagram view of a system that is controlled in accordance with an embodiment of the present disclosure.

FIG. 8 shows a diagrammatic representation of one embodiment of a computing device in the exemplary form of a computer system 800 within which a set of instructions for causing a control system, such as the system 200 of FIG. 2, to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Memory 808 may include various components (e.g., machine readable media) including, but not limited to, a random access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

In operation, the database 220 can be stored on a storage device associated with the computer of FIG. 8 (such as in storage device 824) or on storage devices that are the same as those of storage device 824, except on a remote device 848 accessed through the network 844 via the network interface 840 (such as would be the case when using a cloud-based database solution as mentioned above). Alternatively, and as previously stated, the present disclosure can be implemented in a software-as-a-service through a cloud connection, in which case the user would enter user input data via a GUI 212 that is provided on a remote device 848, and where the remaining portions of the software system 200 are resident on the storage device 824 of a central (cloud) server 800, and such that the inputs are supplied via network 844 and network interface 840 to a central server device 800, the inputs causing the processor to execute the program instructions of the present disclosure that are resident in central storage 828.

The foregoing has been a detailed description of illustrative embodiments of the invention. Various modifications and additions can be made without departing from the spirit and scope of this invention. For example, the screen views of the present disclosure could be for an entire screen (such as shown in FIGS. 6 and 7) or they could be rendered along the side of, for example, a product ordering screen. While aspects of the present disclosure have been described with reference to particular business variables and prices, other business variables and/or prices could be employed. Examples include price per unit, quality ratings, shipping carriers, and shipping distance. These business variables could be presented as sliders such as 604 or as given values as in 655 and 657. Furthermore, the sliders 604 could be in the form of dials or other type of user interface elements that allow interaction by mouse or gesture rather than entering numbers. That said, any of the business values applicable here could be designated in any form. In addition, while the parameter interrelationship information 226 was expressed above as general linear mathematical interrelationships, in practice they could be any sort of interrelationships, such as nonlinear (exponential, logarithmic, and the like) or other relativistic indicators, optionally based on a factory or manufacturing model or simulator/simulation, as may be available via an enterprise resource planning or other application. Moreover, while aspects of the present disclosure have been described with reference to a 3D computer model, the principles of the present disclosure are applicable to other types of programs in which multiple business variables and/or prices may be applicable, including but not limited to programs for enterprise resource planning (ERP), materials requirements planning (MRP), product lifecycle management (PLM), and customer relationship management (CRM) systems. In other words, instead of being embedded in a CAD program, aspects of the present disclosure could be embedded in one or more other types of systems that manage production, such as the manufacture of apparel, among others. Both sheet metal and apparel designers use CAD systems to design their products, using sheets of flat material for manufacture. Design data, such as material choice, precise dimensions, or locations of additional features may be embedded within the digital design. Designers may choose different metals or fabrics (including non-woven materials such as leather) depending on the strength and other inherent properties of the material, which may determine which manufacturing methods will be necessary to work the material. Purchased components (in some cases, identical purchased components) may be added to the design. CAD programs may be used to visualize the shape of the finished product. In both sheet metal and apparel manufacturing the sheet (metal or fabric) may be cut or stamped by a variety of methods using computerized machines. Units are moved from station to station during manufacture. Where sheet metal is connected by rivets or welding, sheet fabric is connected by stitching or gluing. Surface finishes may be applied to both; both may be painted, silk-screened, or otherwise covered with a protective substance.

Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

What is claimed is:

1. A system of providing pricing for one or more instantiations of a structure defined in a three-dimensional (3D) computer model, the system comprising an electronic pricing system, wherein the electronic pricing system is configured to:
   automatedly determine and display a price for a product to be supplied and initial values for a plurality of business variables associated with the price as a function of the 3D computer model as a function of a computer assisted design (CAD) graphical user interface (GUI), wherein automatedly determining the price for a product to be supplied and initial values for the plurality for business variables comprises:
      receiving, via the CAD GUI, an initiation for a price request;
      identifying, via an interrogator and in response to the received initiation for the price request, a discrete shape of a 3D computer model representing the product to be supplied as a function of a CAD system command;
      analyzing, via the interrogator, the identified discrete shape, wherein the analyzing comprises comparing the identified discrete shape to a manufacturing requirement; and
   determine the price for the product to be supplied and initial values for the plurality of business variables associated with the price as a function of the comparison of the identified discrete shape to the manufacturing requirement;
   receive a parameter interrelationship information, wherein the parameter interrelationship information is determined as a function of a nonlinear indicator based on a factory or manufacturing simulation;
   receive a request to lock a value of a first one of the price or one of the plurality of business variables from a user;
   lock the value of the first one of the price or one of the plurality of business variables;
   receive a value for a second one of the price or one of the plurality of business variables from a user;
   automatedly determine acceptable ranges for values of at least two of the plurality of business variables as a function of the parameter interrelationship information including the nonlinear indicator and automatedly indicating the acceptable ranges to a user; and
   automatedly determine and display updated values and an updated acceptable range for one or more of the price and the plurality of business variables.

2. The system of claim 1, wherein the plurality of business variables includes at least a lead time.

3. The system of claim 1, wherein indicating the acceptable ranges includes presenting updated values to the user.

4. The system of claim 1, wherein the electronic pricing system is further configured to automatedly generate an order for one or more instantiations of a product as a function of one or more of the business variables and the 3D computer model.

5. The system of claim 4, wherein automatedly generating the order further comprises automatedly transmitting the order to a supplier.

6. The system of claim 1, wherein the plurality of business variables includes a quantity of product to be supplied.

7. The system of claim 1, wherein the factory or manufacturing model or simulation is provided via an enterprise resource planning, materials requirements planning, product lifecycle management, or customer relationship management system.

8. The system of claim 1, wherein the electronic pricing system is further configured to store one or more determined initial values for the plurality of business variables, one or more values for one or more of the plurality of business variables received from the user, and one or more updated variables in a log.

9. The system of claim 8, further comprising transmitting the log to a supplier.

10. The system of claim 1, wherein the electronic pricing system is further configured to automatedly generate the parameter interrelationship information as a function of the 3D computer model.

11. The system of claim 1, wherein the parameter interrelationship information is specified at least partially in terms of variables that can be interrogated from a 3D computer model.

12. The system of claim 1, wherein the electronic pricing system is further configured to receive the parameter interrelationship information from a supplier or automatedly determining the parameter interrelationship information as a function of information received from a supplier.

13. The system of claim 1, wherein the electronic pricing system is further configured to automatedly determine and display an amount of change associated with one or more of the business variables or the price as a function of the value for the second one of the price or one of the plurality of business variables, the parameter interrelationship information, and the 3D computer model.

14. The system of claim 13, wherein the amount of change is expressed as a percentage.

15. The system of claim 1, wherein the parameter interrelationship information defines relationships between prices for products and each of the plurality of business variables.

16. The system of claim 1, wherein the second one of the price or one of the plurality of business variables is different from the first one of the price or one of the plurality of business variables.

17. The system of claim 1, wherein the electronic pricing system automatedly determines and displays updated values and an updated acceptable range for one or more of the price and the plurality of business variables as a function of the value for the second one of the price or one of the plurality of business variables, the parameter interrelationship information, and the 3D computer model.

18. The system of claim 17, wherein the electronic pricing system automatedly determines and displays updates values and an updated acceptable range for one or more of the price and the plurality of business variables while maintaining the value of the first one of the price or one of the plurality of business variables.

\* \* \* \* \*